US012666539B2

(12) United States Patent
Lehrer et al.

(10) Patent No.: US 12,666,539 B2
(45) Date of Patent: Jun. 23, 2026

(54) SYSTEMS AND METHODS FOR REMOVING UNDESIRED METAL WITHIN VIAS FROM PRINTED CIRCUIT BOARDS

(71) Applicant: TTM Technologies, Inc., Santa Ana, CA (US)

(72) Inventors: Mace Lehrer, San Diego, CA (US); James McKay, San Diego, CA (US); Charles Blessing, San Diego, CA (US)

(73) Assignee: TTM Technologies, Inc., Santa Ana, CA (US)

( * ) Notice: Subject to any disclaimer, the term of this patent is extended or adjusted under 35 U.S.C. 154(b) by 0 days.

(21) Appl. No.: 18/655,174

(22) Filed: May 3, 2024

(65) Prior Publication Data

US 2025/0344323 A1 Nov. 6, 2025

Related U.S. Application Data

(62) Division of application No. 17/092,080, filed on Nov. 6, 2020, now Pat. No. 11,997,800.

(60) Provisional application No. 62/931,690, filed on Nov. 6, 2019.

(51) Int. Cl.
*H05K 3/00* (2006.01)

(52) U.S. Cl.
CPC ........ *H05K 3/0047* (2013.01); *B23B 2226/31* (2013.01); *B23B 2228/10* (2013.01)

(58) Field of Classification Search
CPC . H05K 3/0047; Y10T 408/78; B23B 2226/31; B23B 2226/315; B23B 2228/10
See application file for complete search history.

(56) References Cited

U.S. PATENT DOCUMENTS

| | | | | |
|---|---|---|---|---|
| 4,671,710 A | * | 6/1987 | Araki | B23B 51/02 408/230 |
| 4,681,541 A | * | 7/1987 | Snaper | A61C 3/02 433/165 |
| 4,708,545 A | | 11/1987 | Fuji | |
| 4,975,142 A | | 12/1990 | Iannacone et al. | |

(Continued)

FOREIGN PATENT DOCUMENTS

| | | |
|---|---|---|
| CN | 1935430 A | 3/2007 |
| CN | 104663008 A | 5/2015 |

(Continued)

OTHER PUBLICATIONS

European Patent Application No. 20884799.6, European Search Report dated Dec. 19, 2023, 12 pages.

(Continued)

*Primary Examiner* — Eric A. Gates
(74) *Attorney, Agent, or Firm* — Polsinelli PC

(57) ABSTRACT

A method is provided for modifying a via from a PCB including a plurality of subassemblies comprising a plurality of layers. The method may include drilling a via of the PCB to form a through-hole to remove an unwanted material in the via of the PCB. The method may also include depositing a carbon-based material over an inner wall of the through-hole. The method may further include back drilling a first portion of the through-hole by a drill from the top of the PCB to form a first blind via. The method may also include selectively plating a conductive material over the carbon-based material to form a plated through-hole.

12 Claims, 17 Drawing Sheets

(56) References Cited

U.S. PATENT DOCUMENTS

| | | | |
|---|---|---|---|
| 5,022,801 A | | 6/1991 | Anthony et al. |
| 5,354,155 A | * | 10/1994 | Adams .................... B23B 51/00 |
| | | | 451/259 |
| 6,196,908 B1 | | 3/2001 | Adams |
| 6,620,522 B2 | * | 9/2003 | Kusachi .................... B22F 7/06 |
| | | | 428/553 |
| 6,851,418 B2 | * | 2/2005 | Takemura ................ B24D 7/18 |
| | | | 125/36 |
| 9,358,626 B2 | * | 6/2016 | Kauper .................. B23D 77/00 |
| 9,526,184 B2 | | 12/2016 | Lecesse |
| 9,643,260 B2 | * | 5/2017 | Lipczynski ............... B23C 5/10 |
| 2004/0084321 A1 | | 5/2004 | Thorn et al. |
| 2005/0032254 A1 | | 2/2005 | Cheng et al. |
| 2005/0129349 A1 | | 6/2005 | Tourne |
| 2006/0127652 A1 | | 6/2006 | Kanaya et al. |
| 2006/0255009 A1 | | 11/2006 | Card et al. |
| 2007/0246252 A1 | | 10/2007 | Buchwalter et al. |
| 2008/0296057 A1 | | 12/2008 | Dudnikov, Jr. |
| 2009/0257839 A1 | * | 10/2009 | Lin ......................... B23B 51/02 |
| | | | 427/314 |
| 2010/0038125 A1 | | 2/2010 | Kumar et al. |
| 2014/0001150 A1 | | 1/2014 | Lecesse |
| 2014/0017901 A1 | | 1/2014 | O'Hara |
| 2014/0047709 A1 | | 2/2014 | Kumar et al. |
| 2014/0301797 A1 | * | 10/2014 | Berkmann .............. B23B 41/00 |
| | | | 408/1 BD |
| 2015/0208514 A1 | | 7/2015 | Thomas et al. |
| 2015/0245494 A1 | * | 8/2015 | Araki .................. H05K 3/0047 |
| | | | 408/1 R |
| 2015/0351240 A1 | | 12/2015 | Nabeyama |
| 2016/0021762 A1 | | 1/2016 | Kallman et al. |
| 2016/0278206 A1 | | 9/2016 | Bahl et al. |
| 2016/0278208 A1 | | 9/2016 | Pen |
| 2016/0338191 A1 | | 11/2016 | Tanaka et al. |
| 2019/0141840 A1 | | 5/2019 | Thompson |
| 2019/0182968 A1 | | 6/2019 | Kuczynski et al. |
| 2021/0136928 A1 | | 5/2021 | Lehrer et al. |
| 2022/0053641 A1 | | 2/2022 | Neely et al. |
| 2022/0338348 A1 | | 10/2022 | Gao et al. |
| 2023/0119480 A1 | | 4/2023 | Zhou |

FOREIGN PATENT DOCUMENTS

| | | |
|---|---|---|
| CN | 105491792 A | 4/2016 |
| CN | 106134301 A | 11/2016 |
| CN | 108465849 A | 8/2018 |
| CN | 109640528 A | 4/2019 |
| CN | 109831878 A | 5/2019 |
| CN | 110253039 A | 9/2019 |
| CN | 110278660 A | 9/2019 |
| JP | H05337895 A | 12/1993 |
| JP | 2005116945 A | 4/2005 |
| KR | 20100049842 A | 5/2010 |
| WO | 2011020859 A1 | 2/2011 |

OTHER PUBLICATIONS

International Search Report and Written Opinion from related International Application No. PCT/US2020/059510, dated Mar. 25, 2021; 11 pgs.

PCT/US2022/47943 International Search Report and Written Opinion dated Jan. 31, 2023. 15 pages.

First Office Action for Chinese Patent Application No. 202080077277.8, Dec. 20, 2024, 11 pages.

Search Report and Written Opinion for European Patent Application No. 20884799.6, Apr. 20, 2024, 20 pages.

Search Report and Written Opinion for International Patent Application No. PCT/US2025015643, May 15, 2025, 9 pages.

* cited by examiner

TYPE 2        STEP 3

TYPE 2        STEP 4

400

DRILLING A VIA OF A PCB TO FORM A THROUGH-HOLE — 402

DEPOSITING A LAYER OF CARBON-BASED MATERIAL
OVER THE INNER WALL OF THE THROUGH-HOLE — 406

BACK DRILLING A PORTION OF THE THROUGH-HOLE
TO FORM A SINGLE OR DOUBLE SIDE BLIND VIAS — 410

SELETIVELY PLATING A CONDUCTIVE MATERIAL
OVER THE CARBON-BASED MATERIAL — 414

TYPE 3          STEP 5

TYPE 3          STEP 6

SYSTEMS AND METHODS FOR REMOVING UNDESIRED METAL WITHIN VIAS FROM PRINTED CIRCUIT BOARDS

CROSS-REFERENCES TO RELATED PATENT APPLICATIONS

This patent application is a divisional of U.S. patent application Ser. No. 17/092,080, entitled "SYSTEMS AND METHODS FOR REMOVING UNDESIRED METAL WITHIN VIAS FROM PRINTED CIRCUIT BOARDS," filed on Nov. 6, 2020, which claims the benefit under 35 U.S.C. § 119 (e) of U.S. Patent Application Ser. No. 62/931, 690, entitled "SYSTEMS AND METHODS FOR REMOVING UNDESIRED METAL WITHIN VIAS FROM PRINTED CIRCUIT BOARDS," filed on Nov. 6, 2019, which is incorporated herein by reference in its entirety.

FIELD

The disclosure is directed to systems and methods for removing stubs from printed circuit boards (PCB).

BACKGROUND

Consumers are increasingly driving the electronic industry to design and produce smaller and faster electronic devices. During fabrication portions of circuit traces may be removed, while leaving behind small conductive stubs. Thus as electronic devices continue to decrease in size; the frequency of signals transmitted through or within the devices also increases. These stubs may radiate noises under high frequency applications. There remains a need to removing the stubs in the vias of the PCB.

BRIEF SUMMARY

In an aspect, a method is provided for modifying a via of a printed circuit board (PCB). The method may include drilling the via of the PCB to form a through-hole to remove an unwanted material in a via of the PCB. The method may also include depositing a carbon-based material over an inner wall of the through-hole. The method may further include back drilling a first portion of the through-hole by using a drill from the top of the PCB to form a first blind via. The first blind via is aligned with the through-hole. The method may also include selectively plating a conductive material over the carbon-based material to form a stub-less or "zero-stub" plated through-hole. The conductive material does not adhere to the first blind via.

In an aspect, a method is provided for modifying a via from a PCB. The method may include drilling the via of the PCB to form a through-hole to remove an unwanted material in a via of the PCB. The method may also include plating a first conductive material over an inner wall of the through-hole. The method may also include back drilling a first portion of the through-hole by using a drill from the top of the PCB to form a first blind via. The first blind via is aligned with the through-hole. The method may further include depositing a carbon-based material over the first blind via. The method may also include vapor etching to remove the first conductive material from the inner wall of the through-hole. The method may further include selectively plating a second conductive material over the carbon-based material to form a stub-less plated blind via. The second conductive material does not adhere to the inner wall of the through-hole.

In an aspect, a drill for back drilling may include an inner core comprising a non-conductive material. The drill may also include an outer coating layer disposed over the inner core. The outer coating layer may include a first cutting portion, a second cutting portion opposite to the first cutting portion, the first and second cutting portions extending from a bottom of the inner core. The drill may also include a non-conductive coating disposed over a portion of the outer coating layer between the first and second cutting portions.

Additional aspects and features are set forth in part in the description that follows, and in part will become apparent to those skilled in the art upon examination of the specification, or may be learned by the practice of the aspects discussed herein. A further understanding of the nature and advantages of certain aspects may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as various aspects of the disclosure and should not be construed as a complete recitation of the scope of the disclosure, wherein.

DETAILED DESCRIPTIONS

The disclosure may be understood by reference to the following detailed description, taken in conjunction with the drawings as described below. It is noted that, for purposes of illustrative clarity, certain elements in various drawings may not be drawn to scale.

Printed circuit boards (PCBs) are the structural foundation of most electronic devices. PCBs are used to mount various electronic components of an electronic device and to enable electrical interconnectivity and/or isolation between the electronic components. PCBs are frequently formed by laminating a plurality of conducting layers with one or more non-conducting layers that are interconnected by a plated vertical interconnect access (via). The plated via or plated through-hole in the PCB enables the transmission of electrical signals between the different layers. The plated vias or through-holes may also be used for component insertion.

The PCB may be assembled from a plurality of PCB subassemblies. Each subassembly includes a number of layers including metal traces and dielectric layers or insulators. The PCB assembly may include multiple layers. The PCB can support various electronic components and includes electronic circuits for controlling the electronic components. The PCB includes vias or through-holes to provide electrical connections between layers in the electronic circuits of the PCB and go through the plane of one or more adjacent layers. For example, the following co-owned patent are directed to assembling subassemblies to form a PCB, US Patent Application Publication No. 2014/0047709, entitled "Systems and Methods of Manufacturing Printed Circuit Boards Using Blind and Internal Micro Vias to Complete Subassemblies," filed on Oct. 28, 2013; US Patent Application Publication No. 2010/0038125, entitled "Additional Functionality Single Lamination Stacked Via with Plated Through Holes For Multilayer Printed Circuit Boards," filed on Aug. 11, 2009, each of the foregoing references is incorporated by reference in its entirety. The through-holes may include stubs, such as disclosed in U.S. Pat. No. 9,526,184, entitled "Circuit Board Multi-Functional Hole System and Method, which is also incorporated by reference in its entirety.

When the PCB subassemblies are integrated together to form the PCB including multiple layers, stubs may be formed as protruded portions near the end of internal traces in vias or through-holes. The stubs are formed of the same metal as the metal traces. The stubs may be equivalent to antenna to generate noises under high frequency applications, such as at one or more radio frequency (RF) from 100 MHz to 70 GHz. To reduce the noises under high frequency applications, it is desirable to remove the stubs and form vias without stubs or stub-less vias in a PCB when the PCB subassemblies are integrated or assembled together to form the PCB.

Figure 1A:
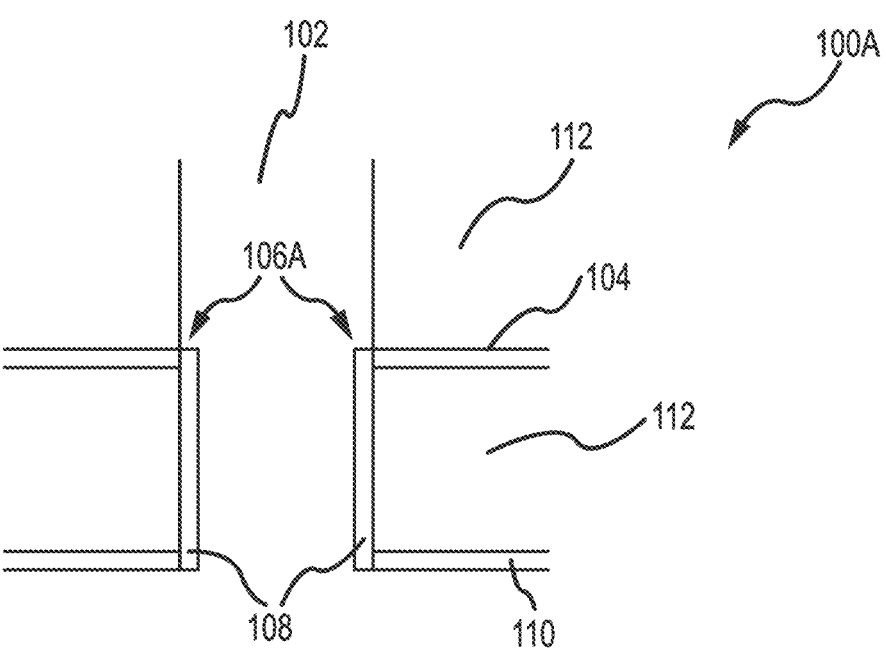
FIG. 1A depicts a conventional via with stubs near corner connections between internal traces and plated conductive layer inside the via in accordance with a first aspect of the disclosure.

FIG. 1A depicts a conventional via with stubs near corner connections between internal traces and plated conductive layer inside a via in accordance with a first aspect of the disclosure. A PCB may include multiple layers of conductive paths or metal traces and insulators or dielectric material. As shown in FIG. 1A, a PCB 100A may include one or more conducting layers 104 and 110 that are separated by one or more dielectric layers 112. As an example, an internal conducting layer or a metal trace 104 is supported by a layer of insulator or dielectric material 112. A bottom conducting layer or a metal trace 110 is below the dielectric material or insulator 112. The PCB 100A may also include a layer of conductive material 108 deposited on an inner wall of via 102 to connect the bottom metal trace 110 to the internal metal trace 104.

Via plating 106A are internal connections between the internal trace 104 and the layer of conductive material 108 inside via 102. In this example, the via 102 has a lower portion below the plating 106A, and an upper portion above the plating 106A. The upper portion of the via 102 is not plated with a conductive material, while the lower portion of the via 102 is plated with a conductive material 108.

Figure 1B:
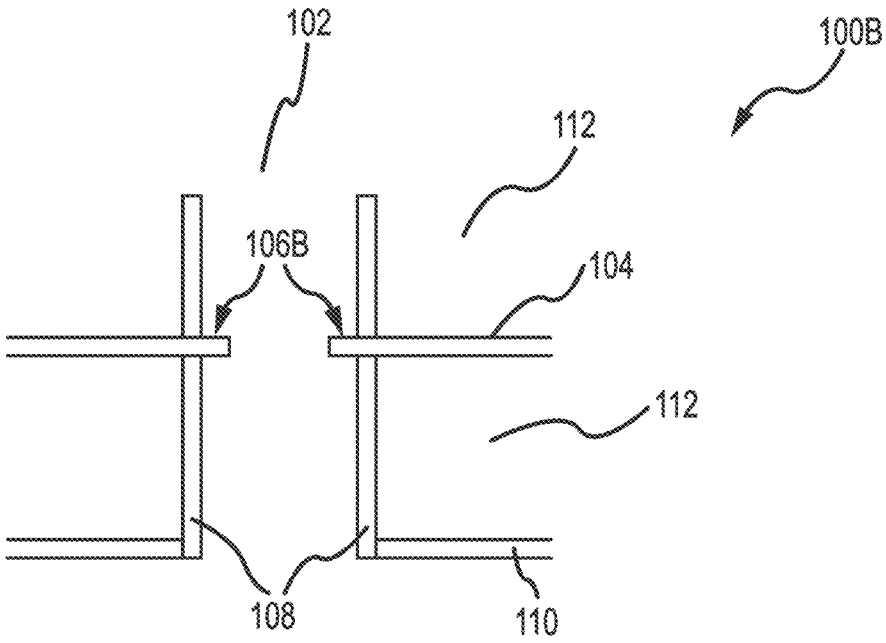
FIG. 1B shows a conventional via with stubs near the end of internal traces in accordance with a second aspect of the disclosure.

FIG. 1B shows a conventional via with stubs 106B near the end of internal traces in accordance with a second aspect of the disclosure. A PCB 100B may include one or more conducting layers 104 and 110 that are separated by one or more dielectric layers 112. As an example, an internal conducting layer or a metal trace 104 is supported by a layer of insulator or dielectric material 112. A bottom conducting layer or a metal trace 110 is below the dielectric material or an insulator 112. The PCB 100B may also include a layer of conductive material 108 deposited on an inner wall of via 102 to connect the bottom metal trace 110 to the internal metal trace 104.

As shown, stubs 106B are protruded portions formed near the end of the internal metal trace 104 inside via 102 upon the incomplete removal of the plating 106A. In this example, the via 102 has a lower portion below the stubs 106B, and an upper portion above the stubs 106B. Both the upper portion of the via 102 and the lower portion of the via 102 are plated with a conductive material 108. The stubs 106B are undesirable, because the stubs may generate noises for high RF applications.

The disclosure provides systems and methods for removing stubs from vias of a PCB. In some aspects, the stubs in the vias of the PCB may be removed by drilling a through-hole to remove the unwanted materials in the vias, followed by back drilling and electroplating. The back drilling uses a drilling tool having a slightly larger diameter than the drilling tool used to create the original via hole. In some aspects, stubs for component vias may be removed by back drilling. The drilling or back drilling can help remove stubs and reduce noises radiated from the stubs.

The disclosure also provides a drilling tool for back drilling. The drilling tool is designed to drill until the drilling tool touches an internal trace of the PCB and then can accurately stop at the internal trace of the PCB. The drilling tool can drill through a non-conductive carbon-based material.

Figure 2A:
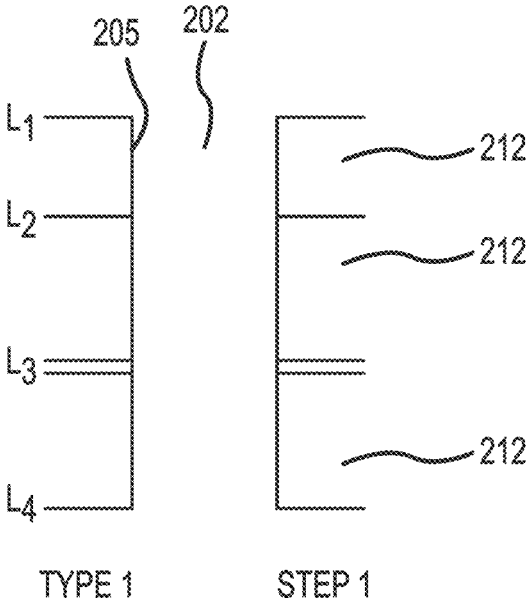
FIGS. 2A-D depict a method of forming a single-side blind via without stubs or stub-less in a multilayer printed circuit board (PCB) in accordance with a first aspect of the disclosure.
Figure 2B:
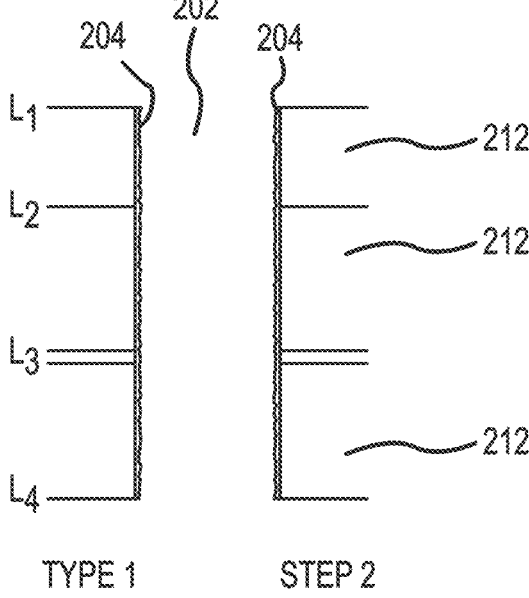
Figure 2C:
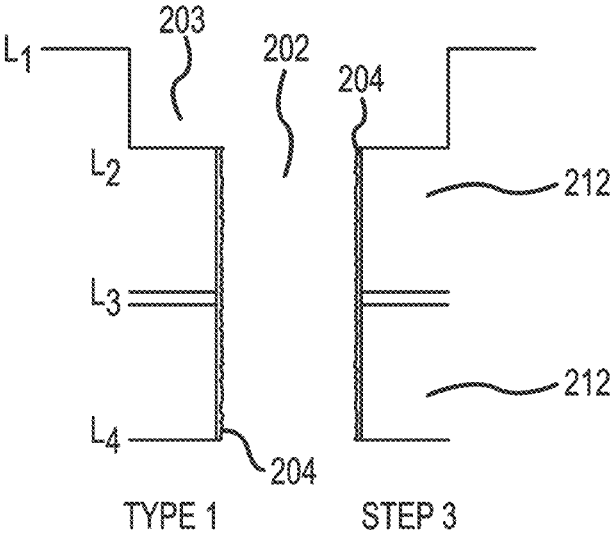
Figure 2D:
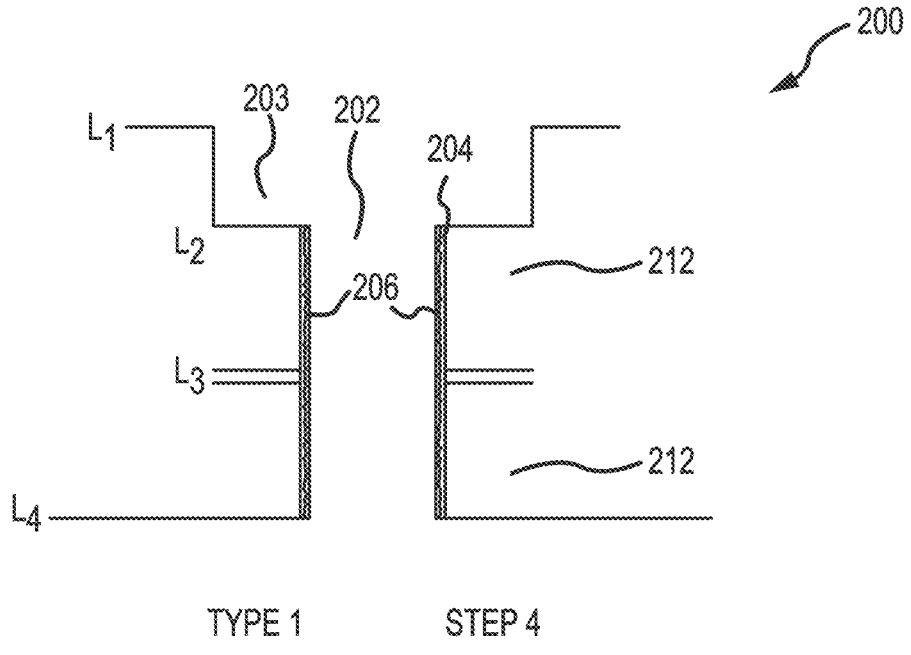

FIGS. 2A-D depict a method of forming a single-side blind via without stubs or stub-less in a multilayer printed circuit board (PCB) in accordance with a first aspect of the disclosure. As shown in FIG. 2D, a multilayer PCB 200 includes multiple layers of conductive paths or metal traces L1-L4 that are separated by one or more dielectric layers 212. The inner wall 205 of the through-hole 202 is plated with a non-conductive carbon-based material 204 and then a conductive material 206, such as copper, is plated over the non-conductive carbon-based material 204.

The method for modifying a via of the multilayer PCB 200 includes (1) drilling a via in the PCB to form a through-hole 202 by removing material, as shown in FIG. 2A; (2) depositing a non-conductive carbon-based material inside the through-hole, as shown in FIG. 2B; (3) back drilling a portion of the through-hole to form a single-side blind via, as shown in FIG. 2C; and (4) plating a conductive material over the non-conductive carbon-based material, as shown in FIG. 2D.

Referring to FIG. 2A now, the first step is to drill a via of the PCB to form a through-hole 202 through the multiplayer PCB including metal traces L1-L4 between dielectric layers 212. The multilayer PCB also includes top metal trace L1 and bottom metal trace L4. The through-hole has the same diameter as the via of the PCB. Referring to FIG. 2B now, the through-hole 202 is then plated with the non-conductive carbon-based material 204.

As shown in FIG. 2C, an upper portion of the through-hole 202 is modified by back drilling the through-hole to a desired depth. A single-side blind via 203 is formed by back drilling the upper portion of the through-hole 202 to L2 with a drilling tool of a larger diameter than the through-hole 202. In the single-side blind via 203, the non-conductive carbon-based material is removed. The single-side blind via 203 is aligned with and substantially concentric with the through-hole 202.

Back drilling typically involves, for example, using a drilling tool that is slightly larger in diameter than the diameter of the drilling tool used to drill the original hole 206. The depth of the upper portion 212 of the hole 206 depends on the product and/or purpose for which the PCB is being designed. The back drilling forms a single-side blind via 203. As shown, the single-side blind via 203 is above the through-hole 202 and has a larger diameter than the through-hole 202. The back drilling can be accurately performed by using the disclosed drilling tool as described later and illustrated in FIGS. 7A-E below. During the back drilling, the metal trace L2 is grounded such that the metal trace L2 can be detected by the drilling tool when the drilling tool hits the metal trace L2.

Lastly, as shown in FIG. 2D, the conductive material 206 (e.g. copper) is selectively flash plated only on the non-conductive carbon-based material 204. The carbon-based material acts as seed or seeding layer for plating the conductive material 206. As such, the conductive material 206 does not extend vertically beyond L2 into the backdrilled via portion 203 to act as an unwanted noise generating stub.

Figure 3A:
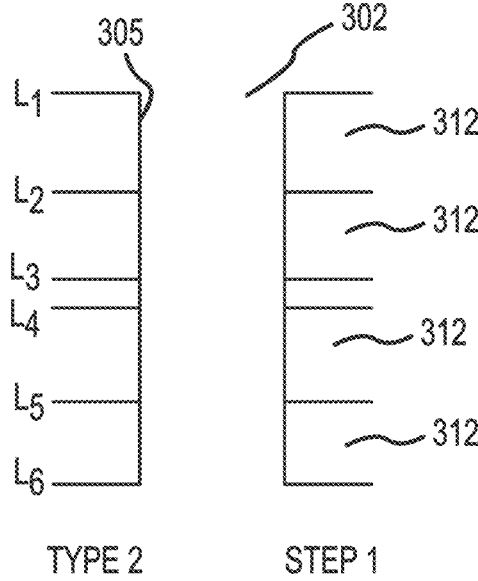
FIGS. 3A-D depict a method of forming a double-side blind via without stubs or stub-less in a multilayer PCB in accordance with a second aspect of the disclosure.
Figure 3B:
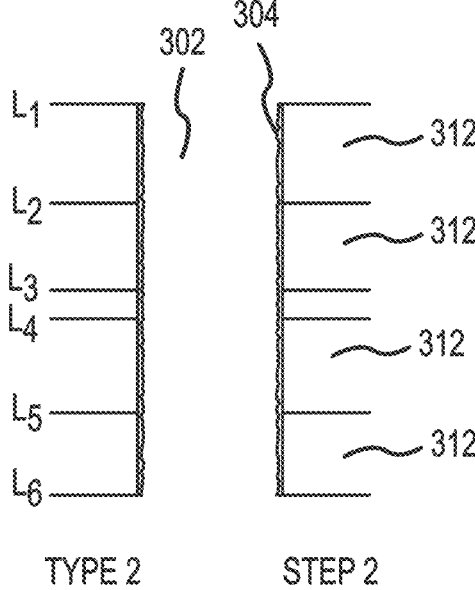
Figure 3C:
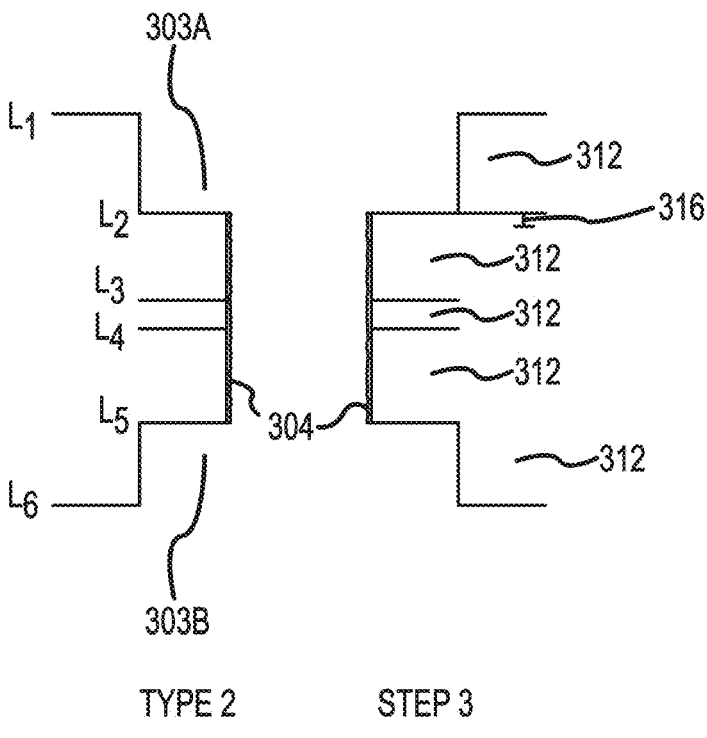
Figure 3D:
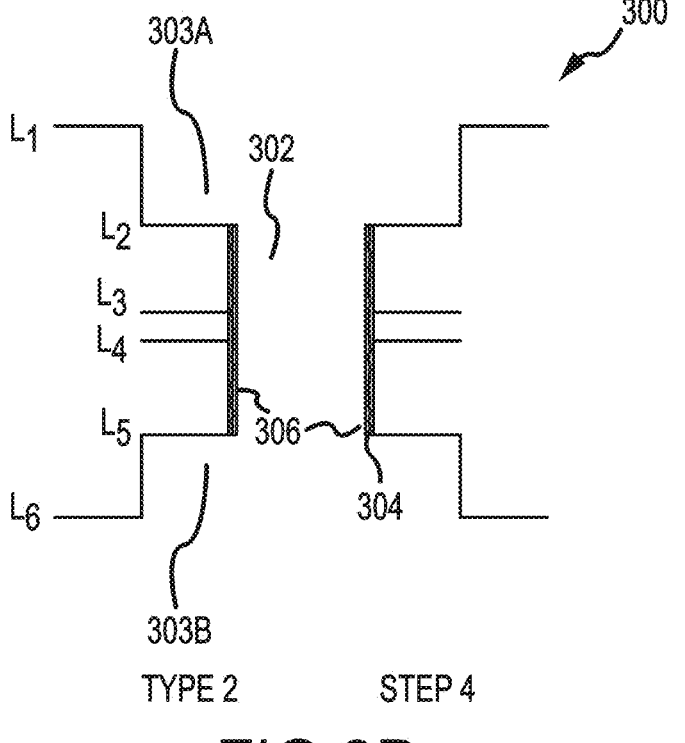

Similar to the method of removing unwanted material from a single-side via, FIGS. 3A-D depict a method of forming a double-side blind via without stubs or stub-less in a multilayer PCB in accordance with a second aspect of the disclosure. As shown in FIG. 3D, a multilayer PCB 300 includes multiple layers of conductive paths or metal traces L1-L6 that are separated by one or more dielectric layers 312. It will be appreciated by those skilled in the art that the number of conducting layers and the number of dielectric layers may vary. The inner wall 305 of the through-hole 302 is deposited with a non-conductive carbon-based material 304 and then plated a conductive material 306, such as copper, over the non-conductive carbon-based material 304.

The method for forming the multilayer PCB 300 includes (1) drilling a via of the PCB to form a through-hole to remove unwanted material in the via, as shown in FIG. 3A; (2) depositing a non-conductive carbon-based material inside the through-hole, as shown in FIG. 3B; (3) back drilling the through-hole to form double-side blind vias, as shown in FIG. 3C; and (4) plating a conductive material over the non-conductive carbon-based material, as shown in FIG. 3D.

The multilayer PCB is formed by drilling a via of the PCB to form a through-hole 302 through the multiplayer PCB including metal traces L1-L6 separated by dielectric layers 312 to remove unwanted material in the via, as shown in FIG. 3A. The through-hole 302 has the same diameter as the via of the PCB. The PCB 300 includes a top conducting layer or metal trace L1, internal conducting layers or metal traces L2 and L3, and a bottom conducting layer or metal trace L6. The inner wall 305 of the through-hole 302 is then deposited with the non-conductive carbon-based material 304, as shown in FIG. 3B.

An upper portion and a lower portion of the through-hole 302 are further modified by back drilling a portion of the through-hole 302 a specified depth into the PCB. The through-hole 302 is back drilled from opposite sides of the PCB to modify the diameter of the through-hole 302 to form double-side blind vias. The double-side blind vias 303A-B are formed by back drilling the top portion to L2 and the bottom portion to L5 with a drilling tool of a larger diameter than the through-hole 302, as shown in FIG. 3C. In the double-side blind vias, the non-conductive carbon-based material is removed. One blind via 303A is above the through-hole 302 while another blind via 303B is below the through-hole 302. The blind vias 303A-B have a larger diameter than that of the through-hole 302.

The back drilling can be accurately performed by using the disclosed drilling tool as described later and illustrated in FIGS. 7A-E below. During the back drilling, the metal trace L2 is grounded such that the metal trace L2 can be detected by the drilling tool when the drilling tool hits the metal trace L2. The conductive material 306 (e.g. copper) is selectively deposited or plated only on the non-conductive carbon-based material 304, as shown in FIG. 3D. It will be appreciated by those skilled in the art that the number of conducting layers and the number of dielectric layers may vary for a particular PCB.

Figure 4:
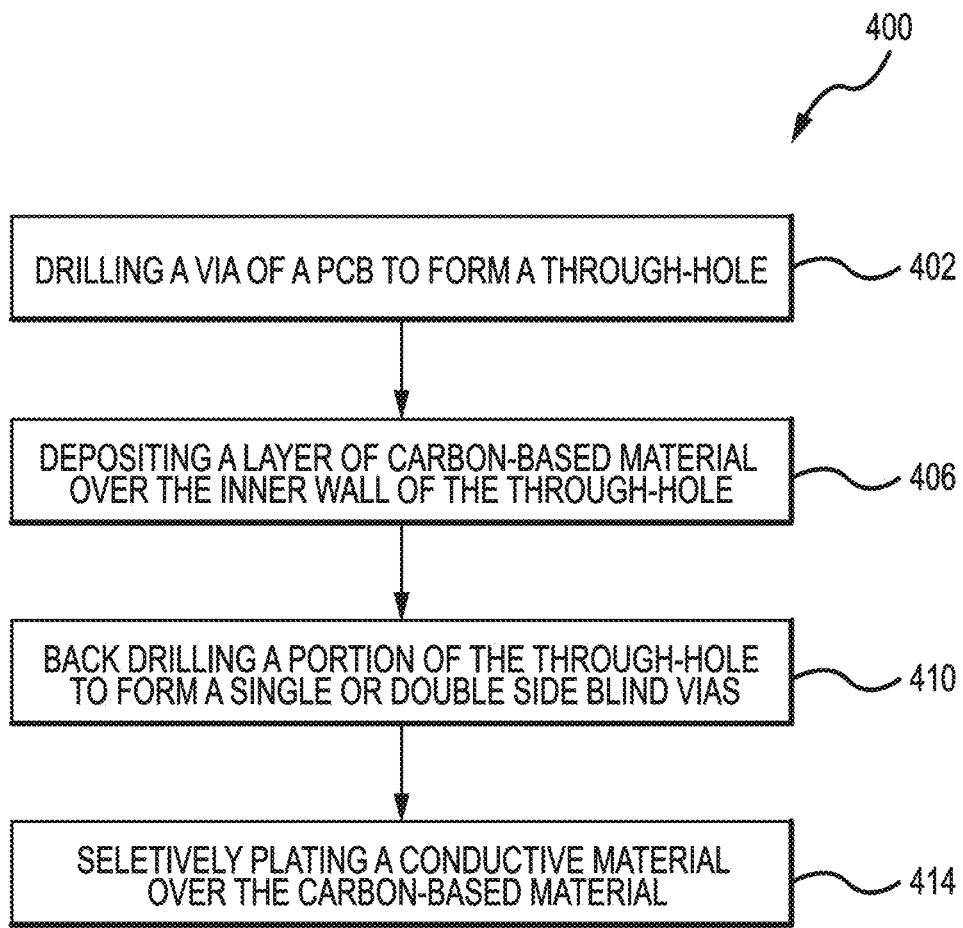
FIG. 4 is a flow chart illustrating the steps of forming the single-side blind via without stubs of FIGS. 2A-D or the double-side blind via without stubs of FIGS. 3A-D in accordance with an aspect of the disclosure.

FIG. 4 is a flow chart illustrating the steps of forming the single-side blind via without stubs of FIGS. 2A-D or the double-side blind via without stubs of FIGS. 3A-D in accordance with an aspect of the disclosure. A method 400 may include drilling a via of a PCB to form a through-hole at operation 402. The method 400 may also include depositing a layer of carbon-based material over the inner wall of the through-hole at operation 406. The carbon-based material is non-conductive. The method 400 may also include back drilling a portion of the through-hole to form a single-side blind via or double-side blind vias at operation 410. The blind via 203 and vias 303A-B are aligned with the respective through-holes 202 and 302. The method 400 may further include plating a conductive material over the carbon-based material at operation 414. The plating may be an electroplating. The plating selectively plates the conductive material (e.g. copper) only onto the carbon-based material in the through-hole 202 or 302, such that the conductive material 206 or 306 is not present in the blind vias 203, or 303A-B. The carbon-based material acts as a seed or a seeding layer for the plating.

For example, in some variations, the conductive material over the through-hole may have a thickness varying from 0.0001 inches to 0.002 inches. In other examples, the non-conductive carbon-based material over the through-hole may have a thickness varying from 60 nanometers to 90 nanometers.

FIGS. 5A-F depict a method of forming a component via without stubs or stub-less in a multilayer PCB in accordance with a third aspect of the disclosure. As shown, a multilayer PCB 500 includes multiple layers of conductive paths or metal traces L1-L6 that are separated by dielectric layers 512. The multilayer PCB 500 is configured to place a component in the blind vias 503A-B. The through-hole 502 is plated with a conductive material 504, such as copper, over a non-conductive carbon-based material 506.

Figure 5A:
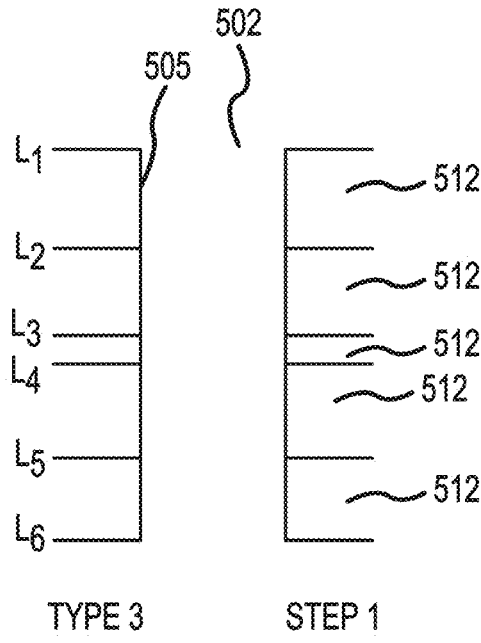
FIGS. 5A-F depict a method of forming a component via without stubs or stub-less in a multilayer PCB in accordance with a third aspect of the disclosure.
Figure 5B:
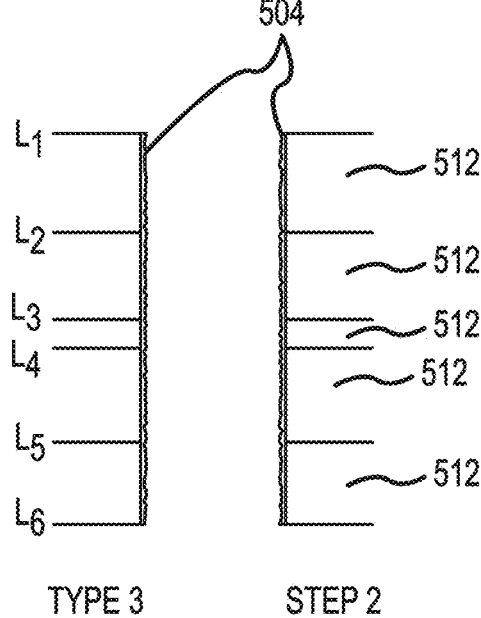
Figure 5C:
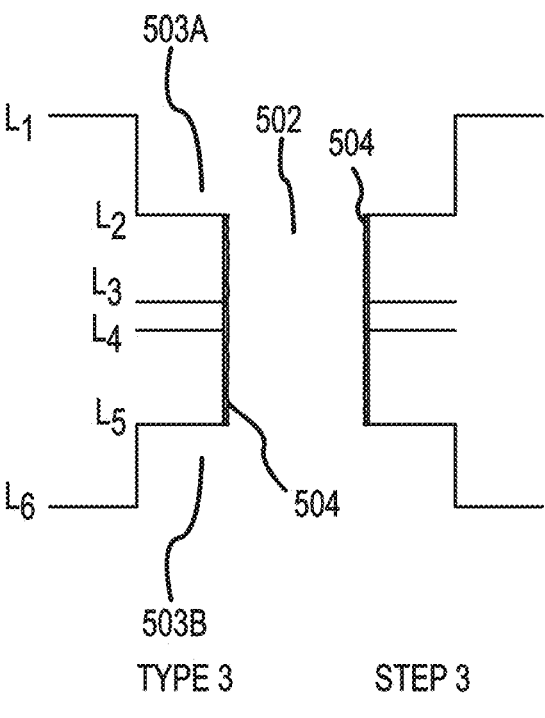
Figure 5D:
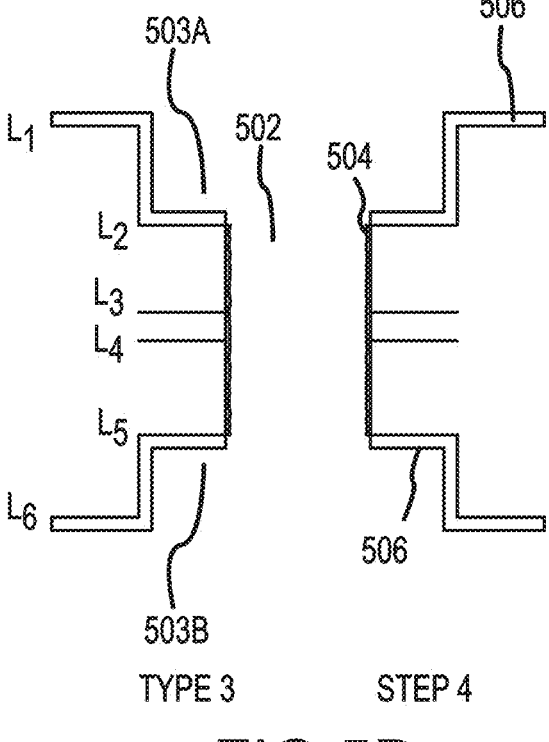

The method for modifying a via of the multilayer PCB 500 includes (1) drilling a via of a PCB to form a through-hole 502, as shown in FIG. 5A; (2) plating a first conductive material inside the through-hole, as shown in FIG. 5B; (3) back drilling a portion of the through-hole to form double-side blind vias, as shown in FIG. 5C; (4) depositing a non-conductive carbon-based material over the double-side blind vias, as shown in FIG. 5D; (5) vapor etching to remove the first conductive material from the through-hole; and (6) plating a second conductive material over the non-conductive carbon-based material in the blind vias.

Specifically, the multilayer PCB 500 is formed by drilling a through-hole 502 through the multiplayer PCB including conducting layers or metal traces L1-L6 separated by dielectric layers 512, as shown in FIG. 5A. The PCB includes the top conducting layer or metal trace L1, internal conducting layers or metal traces L2-L5, and a bottom conducting layer or metal trace L6. The inner wall 505 of the through-hole 502 is then plated with the first conductive material 504, as shown in FIG. 5B. In one aspect the conductive material 504 is an electroless copper strike.

An upper portion and a lower portion of the through-hole 502 are further modified by back drilling a specified depth into the PCB. The through-hole 502 is back drilled from opposite sides of the through-hole 502 to modify the diameter to form double-side blind vias 503A-B. The top portion of the through-hole 502 is back drilled to an internal conducting layer or a metal trace L2, and the bottom portion of the through-hole 502 is back drilled to an internal conducting layer or a metal trace L5 with a drilling tool of a larger diameter than the through-hole 502, as shown in FIG. 5C. The double-side blind via 503A is above the through-hole 502 while the blind via 503B is below the through-hole 302. The blind vias 503A-B have a larger diameter than the through-hole 502. The back drilling can be accurately performed by using the disclosed drilling tool as described later and illustrated in FIGS. 7A-E below. During the back drilling, each of the internal metal traces L2 and L5 is grounded, such that the metal trace L2 or L5 can be detected by the drilling tool when the drilling tool hits the metal trace L2.

As shown in FIG. 5D, a non-conductive carbon-based material 506 is deposited over the blind vias 503A-B. The non-conductive carbon-based material 506 does not adhere to the first conductive material 504 inside the through-hole 502. Thus, the carbon-based material 506 is not deposited within the through-hole 502.

Figures 5E, 5F:
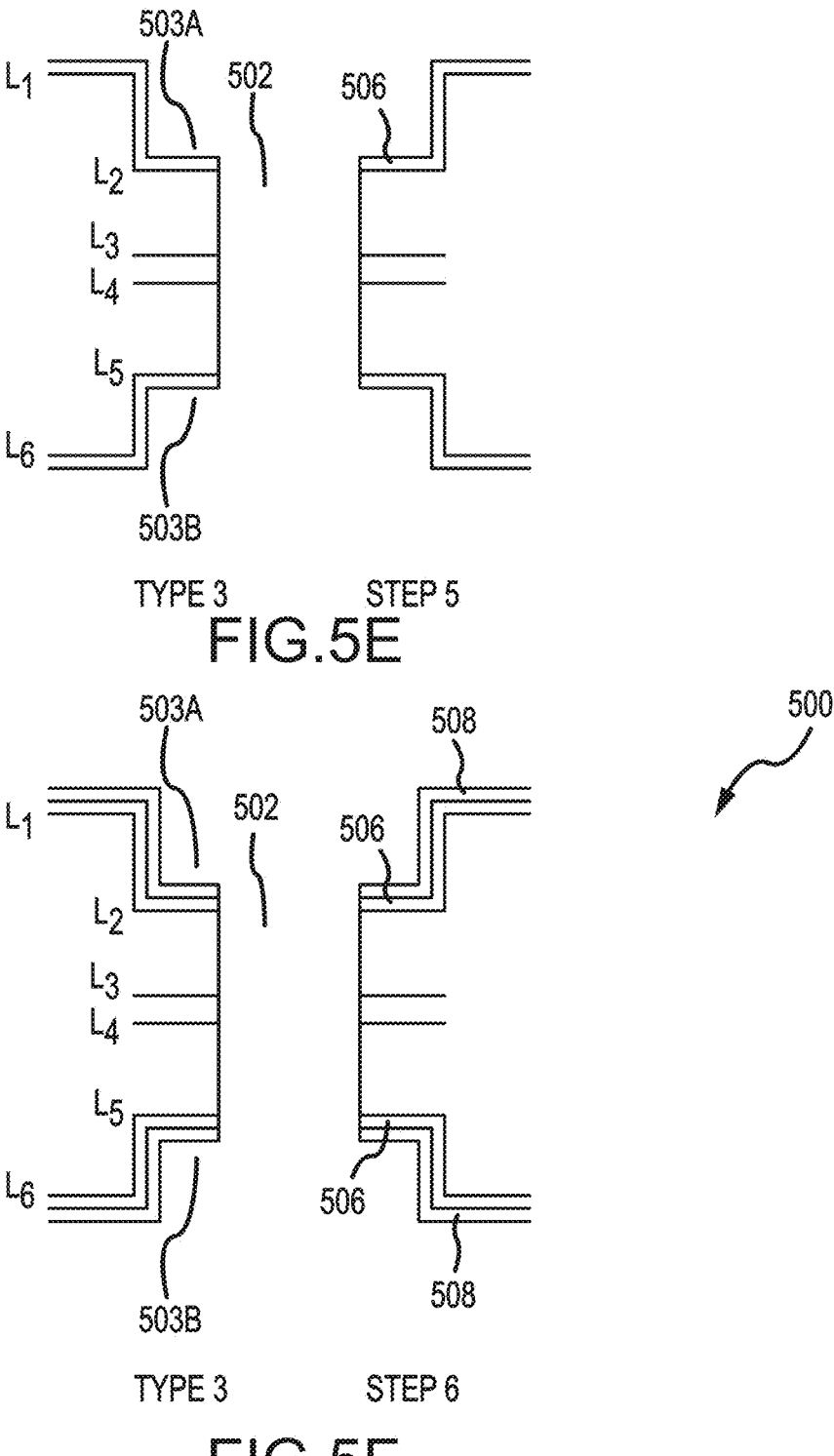

As shown in FIG. 5E, the first conductive material 504 (e.g. plated copper) is removed from the through-hole 502 by vapor etching or micro-etching. Micro-etching is used to selectively remove the first conductive material 504, such as plated copper, but does not remove the non-conductive carbon-based material 506. The productivity and efficiency of the etching method for removing the plated copper is much higher than the mechanical drilling.

As shown in FIG. 5F, a second conductive layer 508 (e.g. copper) is plated or electroplated onto the non-conductive carbon-based material 506 at the upper and lower blind vias 503A-B. The second conductive material 508 is plated or electroplated only on the non-conductive carbon-based material 506. There is no conductive material on the inner surface in the middle portion of the through-hole 502. As a result, the metal trace L2 in the upper portion is isolated or insulated from the metal trace L5 in the lower portion.

It will be appreciated by those skilled in the art that the number of conducting layers and the number of dielectric layers may vary. It will be appreciated by those skilled in the art that the method may also be used to form single-side blind via for a component.

Figure 6:
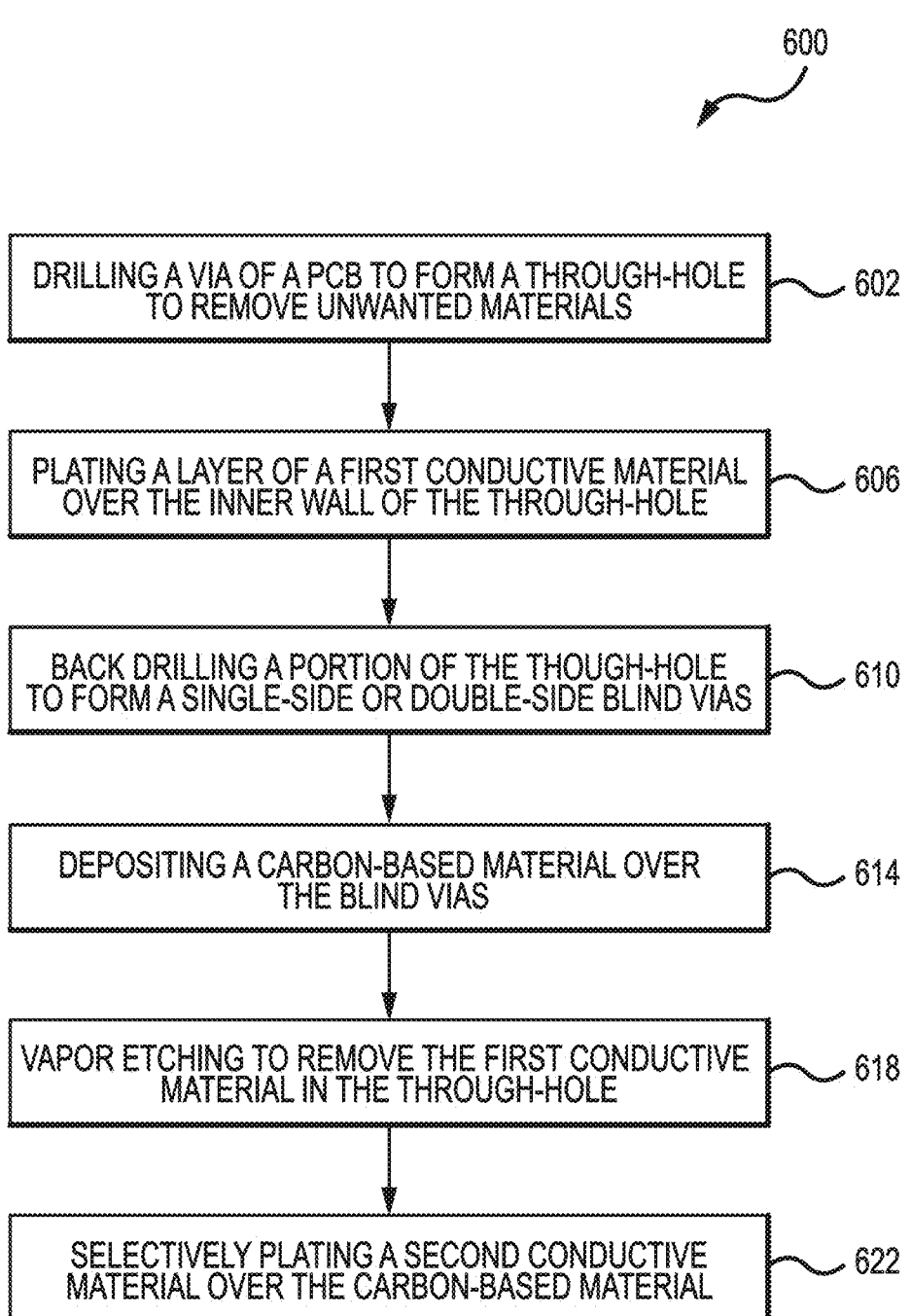
FIG. 6 is a flow chart illustrating the steps of forming the component via without stubs of FIGS. 5A-F in accordance with an aspect of the disclosure.

FIG. 6 is a flow chart illustrating the steps of forming the component via without stubs of FIGS. 5A-F in accordance with an aspect of the disclosure. A method 600 may include drilling a via of a PCB to form a through-hole to remove unwanted materials in the via of the PCB at operation 602. The through-hole may have the same diameter as the via. The method 600 may also include plating a layer of a first conductive material 504 over the inner wall of the through-hole at operation 606. The first conductive material may be electroless copper, among others. The plating may be an electroless copper strike. The method 600 may also include back drilling a portion of the through-hole to form a single-side blind via or a double-side blind vias at operation 610.

The method 600 may further include depositing a carbon-based material 506 over the single or double blind vias at operation 614. The carbon-based material is non-conductive. The carbon based material is selected not to adhere to the plated first conductive material 504, for example copper, such that the carbon-based material 506 is not present in the plated through-hole 502 with the first conductive material 504.

The method 600 may further include vapor etching to remove the plated first conductive material (e.g. copper) in the middle portion of the through-hole at operation 618. The vapor etching does not remove the non-conductive carbon-based material 506 in the single blind via or double blind vias 503A-B.

The method 600 may further include plating a second conductive material 508 over the carbon based material at operation 622. The second conductive material 508 may include copper, among others. The plating may be an electroplating, which would only plate the second conductive material onto the non-conductive carbon-based material in the middle portion of the through-hole 502.

The process for plating the first and second conductive materials may be the same, but the first and second conductive materials may have varying thicknesses. In some variations, the first conductive material over the through-hole may have a thickness varying from 0.0001 inches to 0.0004 inches. In some variations, the second conductive material over the blind vias may have a thickness varying from 0.0005 inches to 0.002 inches.

In some variations, the non-conductive carbon-based material over the blind vias may have a thickness varying from 60 to 90 nanometers.

Figure 7A:
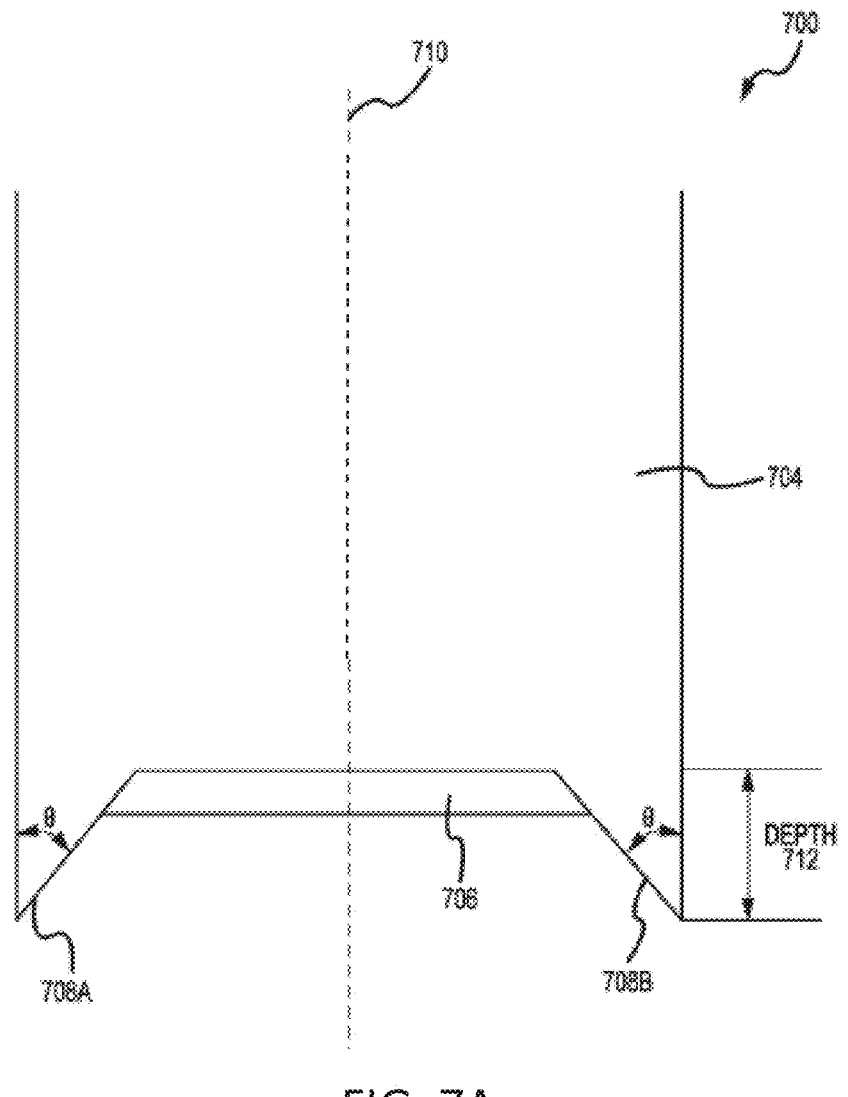
FIG. 7A depicts a side view of the drilling tool in accordance with an aspect of the disclosure.

In some variations, blind vias or through-holes may have a diameter ranging from 0.0295 inches to 0.0595 inches. A conventional drilling tool may not work consistently with the through-hole having a diameter larger than 0.0295 inches. The disclosed drill below can back drill the PCB to form blind vias. FIG. 7D depicts a cross-sectional view of a drilling tool 700 along line A-A in accordance with an aspect of the disclosure. As shown in FIG. 7D, a drilling tool 700 may include an inner core 702 surrounded by an outer coating layer 704. FIG. 7A depicts a side view of the drilling tool in accordance with an aspect of the disclosure.

Various combinations of conductive and non-conductive materials may be used. For example, in some variations, the inner core 702 may include a conductive material or a non-conductive material. In some variations, the outer coating layer 704 may include a non-conductive material or a conductive material. In some variations, the inner core 702 may include a non-conductive material, while the outer coating layer 704 may include a conductive material. In some variations, the inner core 702 may include a conductive material, and the outer coating layer 704 may include a conductive material. In some variations, the inner core 702 may include a non-conductive material, and the outer coating layer 704 may include a non-conductive material. In some variations, the inner core 702 may include a conductive material, while the outer coating layer 704 may include a non-conductive material.

In some aspects, the conductive material of the inner core may include carbide and cobalt among others. In some aspects, the non-conductive material of the outer coating may include diamonds among others. The drilling tool 700 may also include two drill tips or drill cutting portions 708A-B near the bottom of the inner core 702. As shown in FIGS. 7D and 7A, the drill cutting portions 708A-B extend downward from the bottom 716 of the core 702.

In some aspects, the drill cutting portions 708A-B may be formed of the conductive material. The two drill cutting portions 708A-B are substantially symmetric to a vertical centerline 710 of the inner core 702. The two drill cutting portions 708A-B may have a triangle shape including an outer edge substantially parallel to the vertical centerline 710. The cutting portions have an angle θ less than 75° from the outer edge. A depth 712 of the drill cutting portions 708A-B is the distance from the bottom surface 712 of the outer coating layer 704 to end points 713A-B of the drill cutting portions. The depth 712 may vary from 0.010 inches to 0.020 inches.

The drilling tool 700 may also include a non-conductive coating 706 over the outer coating layer 704 between the two drill cutting portions 708A-B, as shown in FIG. 7D. The non-conductive coating may include diamond among others. The non-conductive coating 706 can provide a robust non-conductive cutting surface. As an example, the diamond coating may have thickness of approximately 0.010 inches.

The drilling distance into the non-conductive carbon-based material may vary, and is determined by the difference between the depth 712 and the thickness of the non-conductive coating 706.

It will be appreciated by those skilled in the art that the depth of the drill cutting portions and the non-conductive coating thickness may vary for applications, depending upon the thickness of the non-conductive carbon-based material.

Figure 7B:
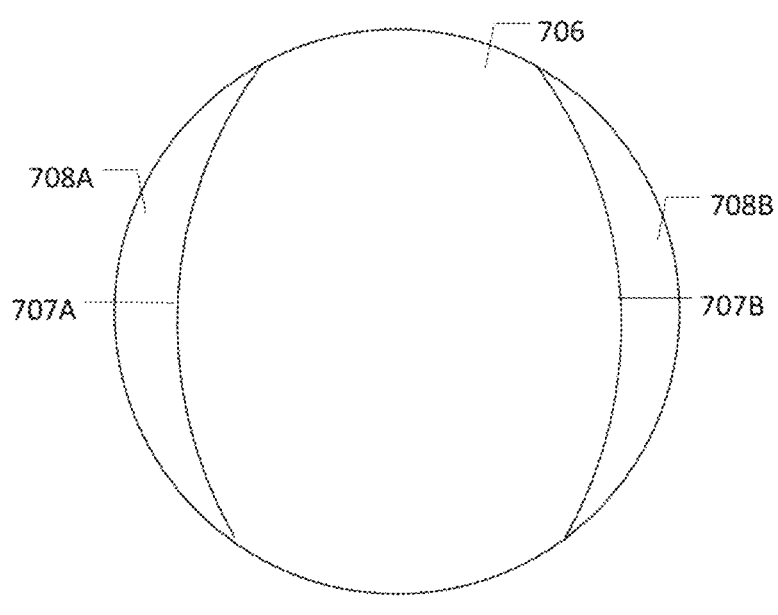
FIG. 7B depicts a bottom view of the drilling tool of FIG. 7A illustrating the drill in accordance with an aspect of the disclosure.

FIG. 7B depicts a bottom view of the drilling tool 700. As shown in FIG. 7B, the drill cutting portions 708A-B are near edges 707A-B of the non-conductive coating 706.

Figure 7C:
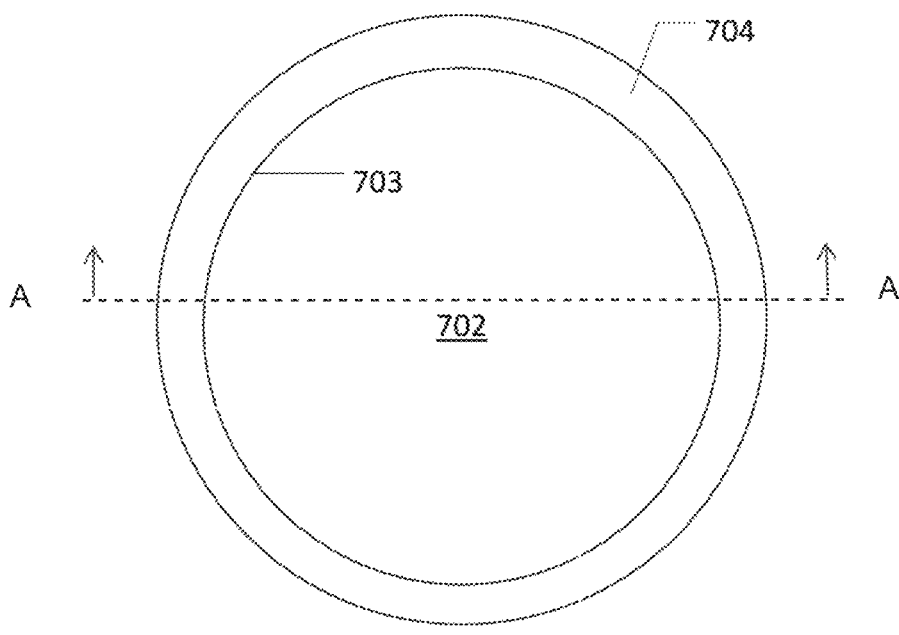
FIG. 7C depicts a top view of the drilling tool of FIG. 7A illustrating the shape of the core and outer coating layer in accordance with an aspect of the disclosure.
Figure 7D:
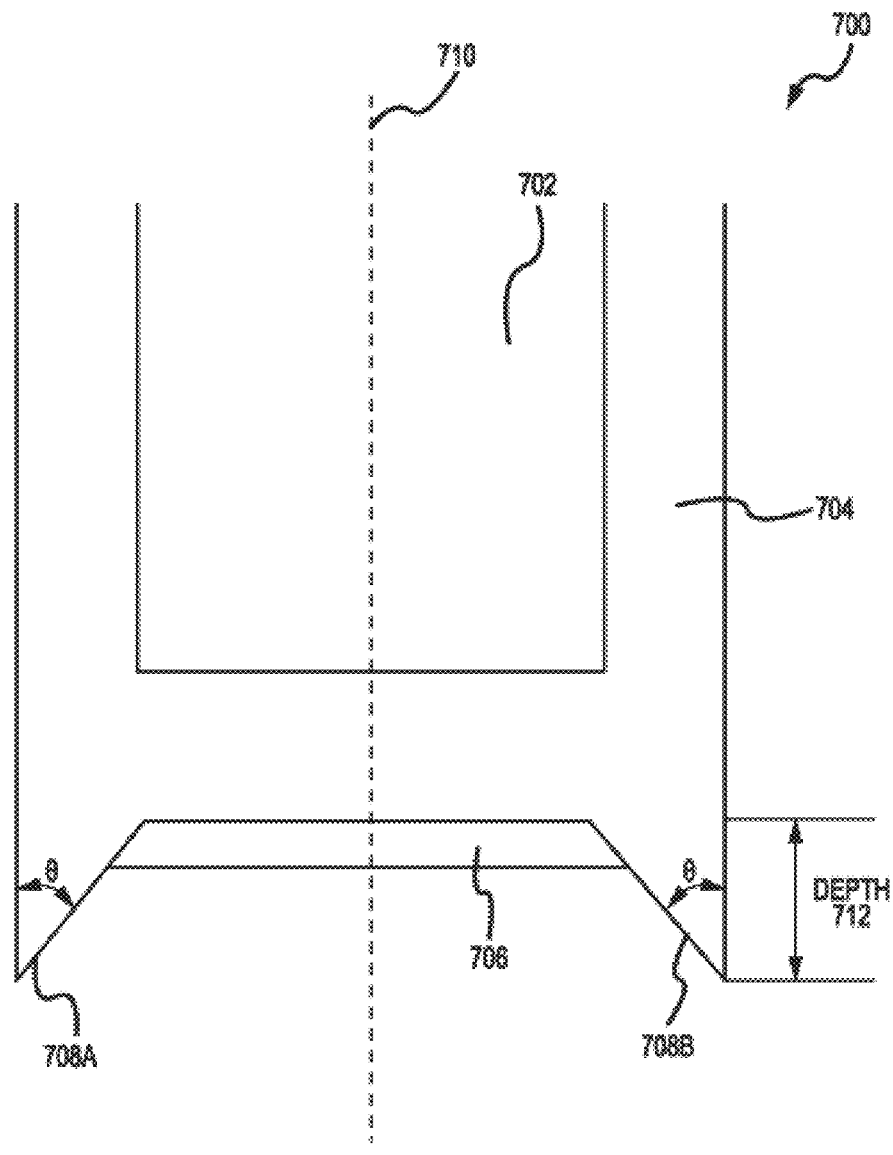
FIG. 7D depicts a cross-sectional view of the drilling tool of FIG. 7A as viewed along line A-A for back drilling in accordance with an aspect of the disclosure.

FIG. 7C depicts a top view of the drilling tool 700 The core 702 can have a cylindrical shape. As shown in FIG. 7C, the core 702 has a cylindrical outer surface 703 from the top view. The outer coating layer 704 is disposed on the cylindrical outer surface 703.

Figure 7E:
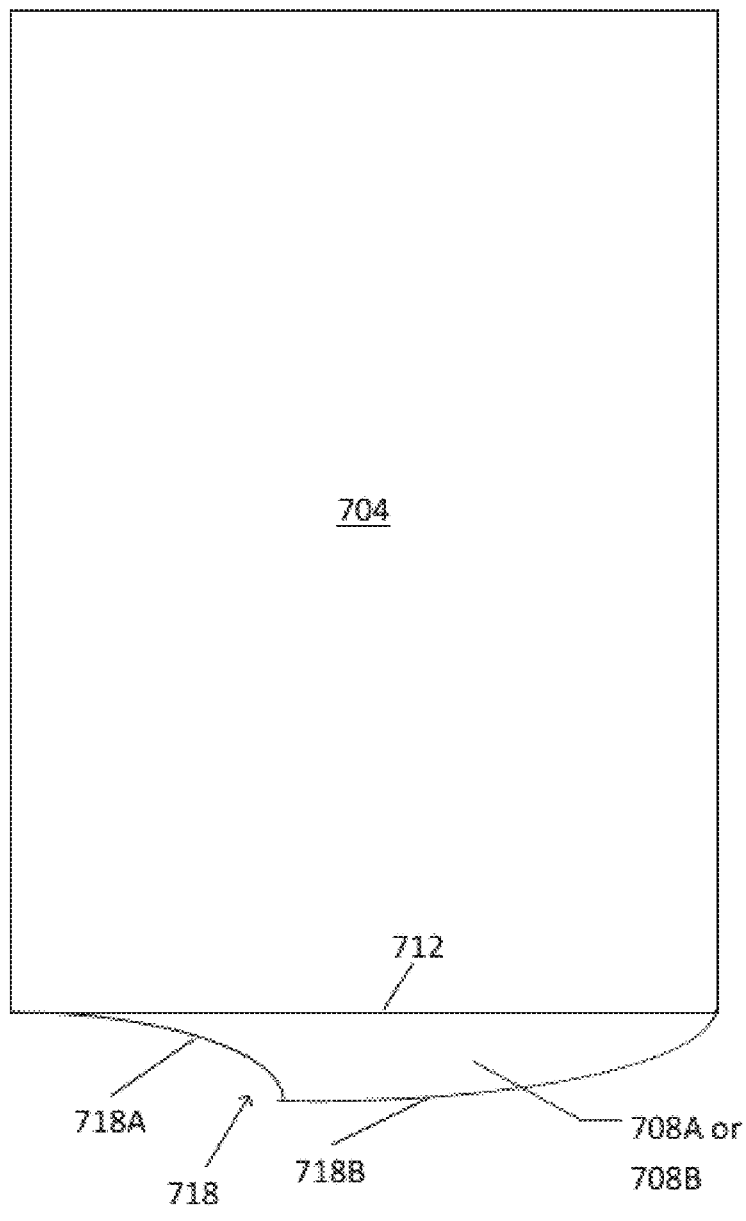
FIG. 7E depicts another side view of the drilling tool illustrating the shape of the drill cutting portion in accordance with an aspect of the disclosure.

FIG. 7E depicts another side view of the drilling tool 700 illustrating the shape of the drill cutting portion in accordance with an aspect of the disclosure. The side view reveals the shape of the drill cutting portion 708A or 708B. In this side view, the drill cutting portions 708A-B overlap. The cutting portion 708A or B has a curved edge under the bottom portion 712 of the outer coating 704. The curved edge may include a first portion 718A configured to cut and a second portion 718B. It will be appreciated by those skilled in the art that the shape and size of the first portion 718A and the second portion 718B of the curved edge 708A-B may vary.

The drilling tool 700 can drill through the non-conductive carbon-based material, but stops when the cutting portions of the drilling tool 700 hit a conductive material, such as that in a conductive layer or trace within a PCB. In one aspect, the conductive material grounded during drilling such that the drilling tool can detect the conductive material through the completion of a circuit.

Figure 10:
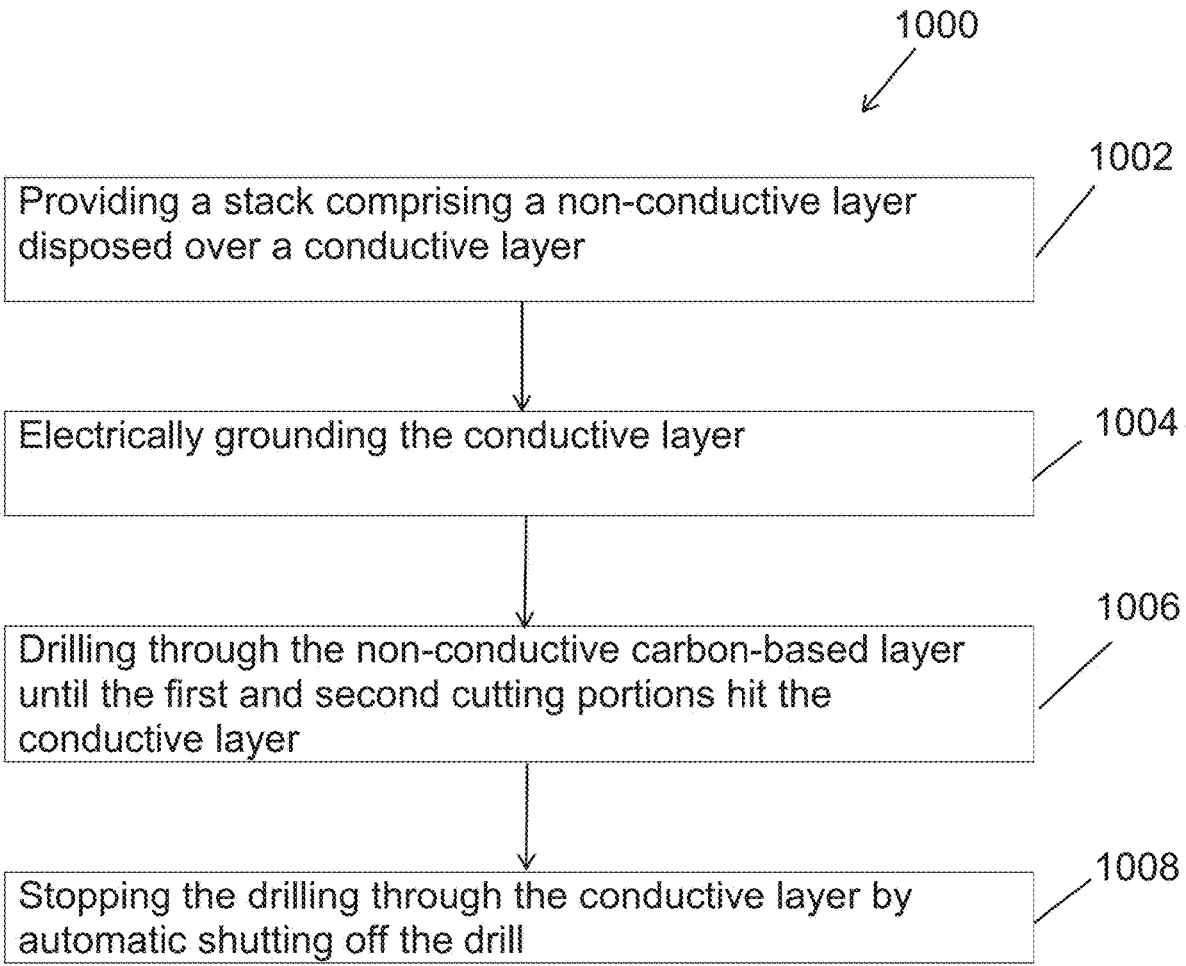
FIG. 10 is a flowchart depicting a method for removing unwanted metal from a via according to one aspect.

In one aspect, a method 1000, illustrated in FIG. 10, for drilling a PCB by using the drill or drilling tool 700 is disclosed. The method may include providing a stack or a PCB comprising a non-conductive layer disposed over one or more conductive layers at step 1002. The conductive layers may be further separated by additional non-conductive layers. For example, the PCB including a plurality of subassemblies comprising a plurality of non-conductive layers and conductive layers.

The method also includes electrically grounding one or more of the conductive layers at step 1004 and drilling through the non-conductive layer until the cutting portion(s) hit a conductive layer at step 1006. Upon contacting the conductive layer, a circuit may be completed or, alternatively, shunted, thus automatically stopping the drill at step 1008. In various aspects, any suitable combination of switches, relays, resistors or other electrical components may be used to automatically stop the drill upon contact with the grounded conductive layer.

The system includes a drilling system including a drilling tool 700 as disclosed herein. The drilling tool can be used for back drilling. This drilling tool is better than the conventional drilling tool, which cannot stop as accurately as the disclosed drilling tool. For example, the conventional drilling tool may stop at a predetermined distance, may be prior to reach the internal trace. The conventional drilling tool may also drill through a portion of the internal trace. An original through-hole can be formed with a conventional drilling tool having a smaller diameter than the drilling tool for back drilling.

The system also includes a deposition system. The deposition system may include one or deposition machines and/or baths. The deposition system is used, for example, to plate a conductive material, such as copper, over the non-conductive carbon-based material within the through-hole 202 as described above in reference to FIG. 2D.

The deposition system can also be used, for example, to plate the conductive material, such as copper, over the non-conductive carbon-based material within the through-hole 302 as described above in reference to FIG. 3D.

The deposition system can also be used to deposit or plate the first conductive material 504, such as copper, inside a through-hole 502 as described in reference to FIG. 5B, and also deposit or plate the second conductive material 508, such as copper, over the non-conductive carbon-based material 506 as described in reference to FIG. 5F.

The deposition system can further deposit or plate the non-conductive carbon-based material 204 inside the through-hole, as described in reference to FIG. 2C. The deposition system can also deposit the non-conductive carbon-based material 304 inside the through-hole 302, as described in reference to FIG. 3C. The deposition system can also deposit the non-conductive carbon-based material 506, in the blind vias, as described in reference to FIG. 5D. In some aspects, the non-conductive carbon-based material may be graphite among others.

The system also includes an etchant system. The etchant system can perform vapor etching or micro-etching to remove the first conductive material, such as plated copper (Cu) in the through-hole, in connection with FIG. 5E. However, the etchant system does not remove the non-conductive carbon-based material that is deposited over the blind vias 503A-B as shown in FIG. 5E.

EXAMPLES

Figure 8:
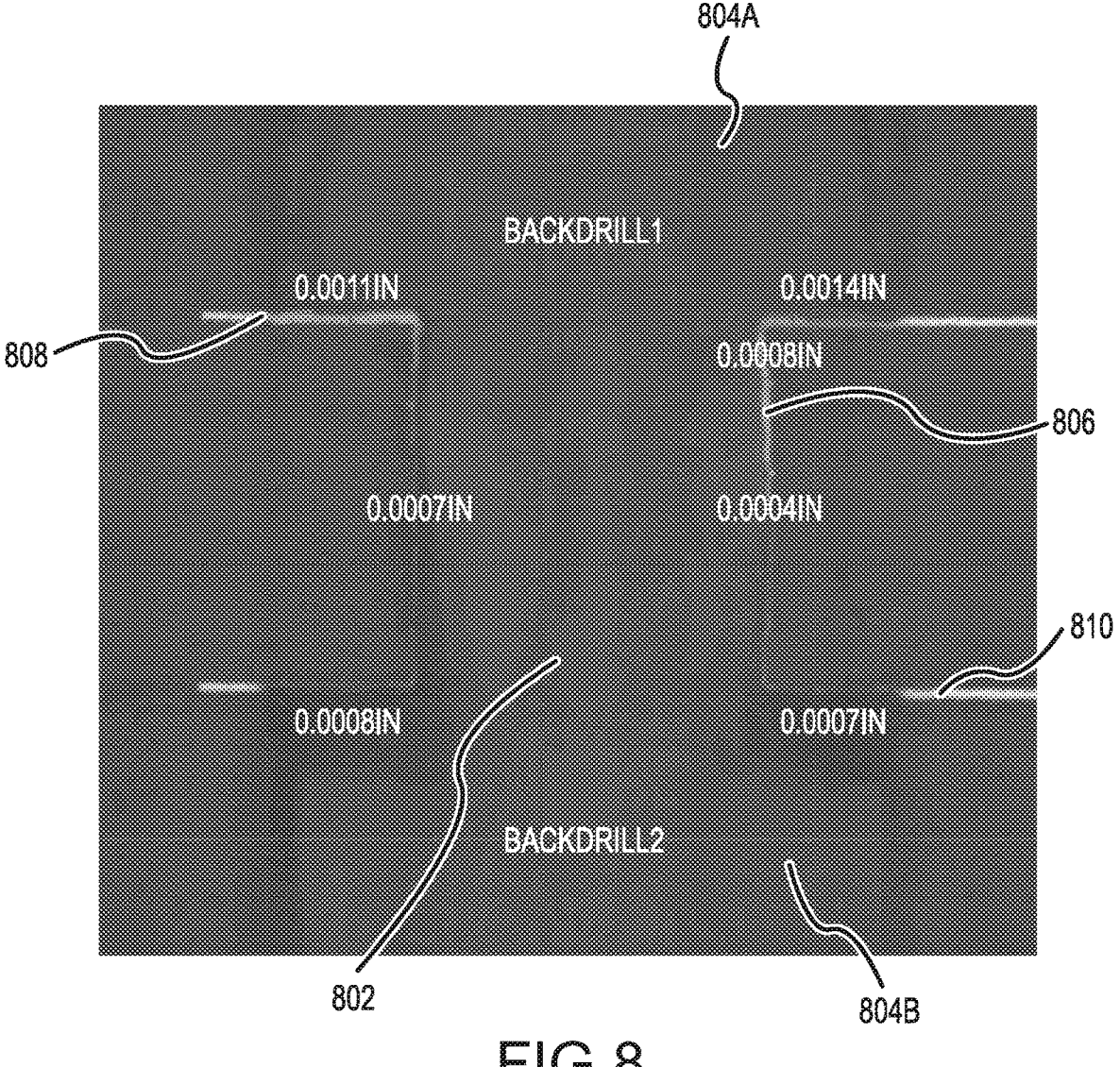
FIG. 8 is an optical photo of a cross-section of a PCB including double-side back drills and a plated through-hole without stubs or stub-less in accordance with an aspect of the disclosure.

Experiments were performed to form stubs less vias in PCB by using the disclosed systems and methods described above. FIG. 8 is an optical photo of a cross-section of a PCB including double-side back drills and a plated through-hole without stubs or stub-less in accordance with an aspect of the disclosure. As shown, a first back drill 804A was above a through-hole 802, and a second back drill 804B is below the through. No stubs were present in the through-hole 802, which was formed by drilling the via of the PCB. The top and bottom blind vias 804A-B had a slightly larger diameter than the through-hole 802. The through-hole 802 was plated with copper 806 (vertical light color layer). The top copper trace 808 (horizontal light color layer) connected to the bottom copper trace 810 (horizontal light color layer) through the plated copper 806 in the through-hole 802. As shown, the plated copper layer had a thickness of 0.0007 inches, 0.0008 inches, and 0.0004 inches at different locations of the inner wall of the through-hole. The bottom copper trace had a thickness of 0.0008 inches and 0.0007 inches at different locations. The top copper trace 808 had thickness of 0.0011 inches and 0.0014 inches at different locations.

Figure 9:
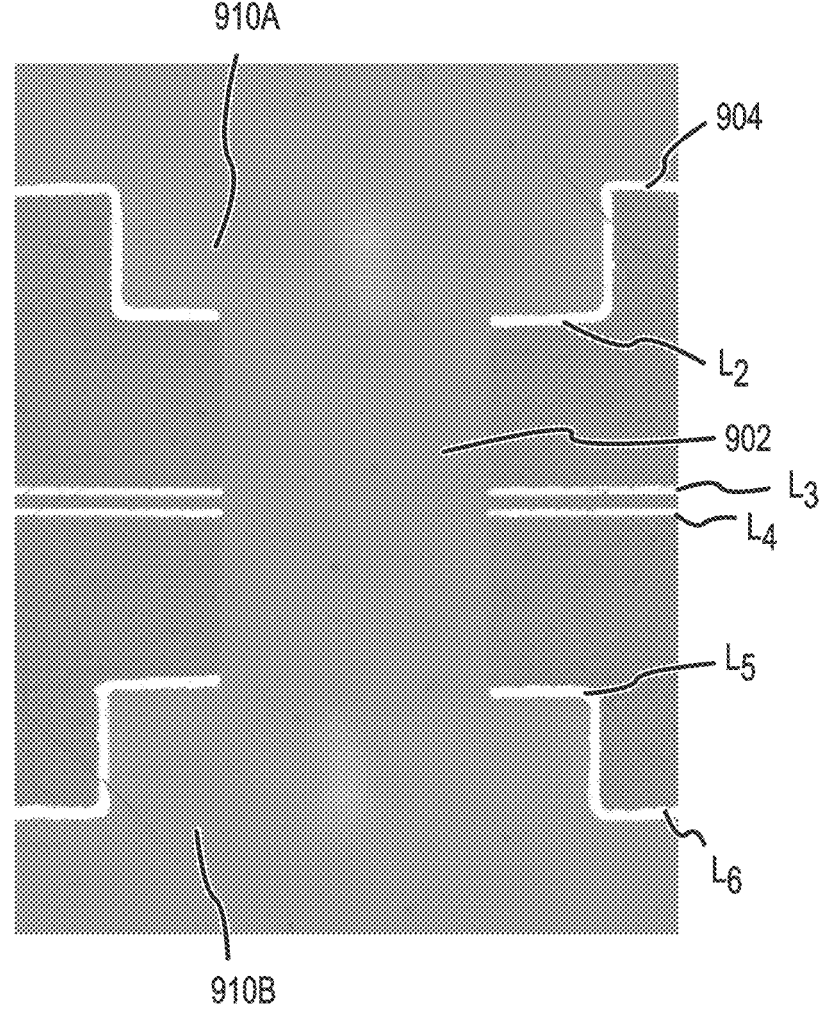
FIG. 9 is an optical photo of a cross-section of a PCB including component vias without stubs or stub-less in accordance with an aspect of the disclosure.

FIG. 9 is an optical photo of a cross-section of a PCB including component vias without stubs or stub-less in accordance with an aspect of the disclosure. This optical photo corresponds to FIG. 5F. As shown, a component can be placed in a blind via 910A or 910B above a through-hole 902. The through-hole 902 was formed by drilling the via of the PCB. The blind via 910A or 910B was formed by back drilling a portion of the through-hole 902 using a drill having a larger diameter than the via or the through-hole 902. The blind via 910A or 910B had a larger diameter than the through-hole 902. There were no stubs at the corner region which was the interface of the blind via 910A or 910B and the through-hole or via 902. The light color layer 904 is the conductive layer.

Having described several aspects, it will be recognized by those skilled in the art that various modifications, alternative constructions, and equivalents may be used without departing from the spirit of the disclosure. Additionally, a number of well-known processes and elements have not been described in order to avoid unnecessarily obscuring the aspects disclosed herein. Accordingly, the above description should not be taken as limiting the scope of the document.

Numerous examples and statements are provided herein to enhance understanding of the present disclosure. A specific set of statements are provided as follows:

Statement 1: A method of modifying a via from a PCB, the method comprising: drilling a via of the PCB to form a through-hole to remove an unwanted material in the via of the PCB; depositing a carbon-based material over an inner wall of the through-hole; back drilling a first portion of the through-hole by using a drill from the top of the PCB to form a first blind via; and selectively plating a conductive material over the carbon-based material to form a plated through-hole.

Statement 2: The method of statement 1, wherein the first blind via is larger than the through-hole having a first diameter.

Statement 3: The method of any one of preceding statements, wherein the carbon-based material is a non-conductive material acting as a seed for plating the conductive material.

Statement 4: The method of any one of preceding statements, wherein the conductive material does not adhere to the first blind via.

Statement 5: The method of any one of preceding statements, wherein the first blind via is aligned with the through-hole.

Statement 6: The method of any one of preceding statements, further comprising back drilling a second portion of the PCB below the through-hole from the bottom of the PCB to form a second blind via.

Statement 7: The method of any one of preceding statements, wherein the second blind is larger than the through-hole.

Statement 8: The method of any one of preceding statements, wherein the conductive material does not adhere to the second blind via.

Statement 9: The method of any one of preceding statements, wherein the conductive material comprises copper.

Statement 10: The method of any one of preceding statements, wherein the plated through-hole is stub-less.

Statement 11: The method of any one of preceding statements, wherein the PCB comprises a plurality of subassemblies comprising a plurality of layers.

Statement 12: A method of modifying a via from a PCB, the method comprising: drilling a via of the PCB to form a through-hole to remove an unwanted material in the via of the PCB; plating a first conductive material over an inner wall of the through-hole; back drilling a first portion of the through-hole by a drill from the top of the PCB to form a first blind via; depositing a carbon-based material over the first blind via; vapor etching to remove the first conductive material from the inner wall of the through-hole; and selectively plating a second conductive material over the carbon-based material to form a first plated blind via.

Statement 13: The method of statement 12, wherein the first blind via is larger than the through-hole.

Statement 14: The method of any one of statements 12-13, wherein the carbon-based material is a non-conductive material acting as a seed for plating the second conductive material.

Statement 15: The method of any one of statements 12-14, wherein the first blind via is aligned with the through-hole.

Statement 16: The method of any one of statements 12-15, wherein the second conductive material does not ad-here to the inner wall of the through-hole.

Statement 17: The method of any one of statements 12-16, vapor etching does not remove the carbon-based material.

Statement 18: The method of any one of statements 12-17, wherein the first plated blind via is stub-less.

Statement 19: The method of any one of preceding statements 12-18, wherein the PCB comprises a plurality of subassemblies comprising a plurality of layers Statement 20: The method of any one of statements 12-19, further comprising: back drilling a second portion of the PCB below the through-hole to form a second blind via larger than the first diameter of the through-hole; depositing the carbon-based material over the second blind via; vapor etching to remove the first conductive material from the inner wall of the through-hole; and selectively plating a second conductive material over the carbon-based material to form a second plated blind via.

Statement 21: The method of statement 20, wherein the second blind via is larger than the through-hole.

Statement 22: The method of any one of statements 20-21, wherein the second plated blind via is stub-less.

Statement 23: The method of any one of statements 20-22, wherein the first conductive material comprises copper.

Statement 24: The method of any one of statements 20-23, wherein the second conductive material comprises copper.

Statement 25: A drill comprising: an inner core comprising a conductive material; an outer coating layer disposed over the inner core, the outer coating layer comprising a first cutting portion, a second cutting portion opposite to the first cutting portion, the first and second cutting portions extending from a bottom of the inner core; and a non-conductive coating disposed over a portion of the outer coating layer between the first and second cutting portions.

Statement 26: The drill of statement 25, wherein the portion of the outer coating layer between the first cutting portion and the second cutting portion is under the bottom of the inner core.

Statement 27: The drill of any one of statements 25-26, wherein the non-conductive coating comprises diamonds.

Statement 28: The drill of any one of statements 25-27, wherein each of the first and second cutting portions comprises a tip pointing downward from the bottom of the inner core.

Statement 29: The drill of any one of statements 25-28, wherein the core has a substantially cylindrical shape.

Statement 30: The drill of any one of statements 25-29, wherein the conductive material of the inner core comprises carbide and cobalt.

Statement 31: The drill of any one of statements 25-30, wherein the first and second cutting portions have a depth from 0.010 inches to 0.020 inches.

Statement 32: The drill of any one of statements 25-31, wherein the first cutting portion has a shape substantially symmetric to the second cutting portion from a vertical centerline of the inner core.

Statement 33: The drill of any one of statements 25-32, wherein each of the first and second cutting portions have an angle θ less than 75° from an outer edge.

Statement 34: A method of drilling with the drill of statements 25-33, the method comprising: providing a stack comprising a non-conductive layer disposed over a conductive layer; electrically grounding the conductive layer; drilling through the non-conductive carbon-based layer until the first and second cutting portions hit the conductive layer; and stopping the drilling through the conductive layer by automatic shutting off the drill.

Statement 35: The method of statement 34, wherein the stack comprises a PCB including a plurality of subassemblies comprising a plurality of non-conductive layers and conductive layers Those skilled in the art will appreciate that the presently disclosed aspects teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the method and system, which, as a matter of language, might be said to fall there between.

What is claimed:

1. A drill for use in back drilling of a PCB, the drill comprising:
an inner core comprising a solid cylindrical body having an outer cylindrical surface and a closed planar end surface coupled to the outer cylindrical surface, the closed planar end surface being substantially perpendicular to a vertical central axis of the solid cylindrical body;
a continuous outer coating layer disposed over the outer cylindrical surface and the closed planar end surface of the inner core, the outer coating layer comprising a first cutting portion, a second cutting portion opposite to the first cutting portion, and an inner middle portion coupled between the first and second cutting portions, the first and second cutting portions comprising a conductive material and extending outwardly from the closed planar end surface of the inner core; and
a non-conductive coating disposed over the inner middle portion of the outer coating layer between the first and second cutting portions.

2. The drill of claim 1, wherein the inner middle portion of the outer coating layer between the first cutting portion and the second cutting portion is outside the closed planar end surface of the inner core.

3. The drill of claim 1, wherein the non-conductive coating comprises diamonds.

4. The drill of claim 1, wherein each of the first and second cutting portions comprises a tip extending outwardly from the closed planar end surface of the inner core.

5. The drill of claim 1, wherein the inner core comprises one of carbide, tungsten, or cobalt.

6. The drill of claim 1, wherein the first cutting portion has a shape substantially symmetric to the second cutting portion from the vertical central axis of the inner core.

7. The drill of claim 1, wherein each of the first and second cutting portions have a triangular shape with an outer edge substantially parallel to the vertical central axis and an inner edge in a cross-sectional view of the drill, the inner edge connecting to the outer edge at an end point and extending toward the closed planar end surface of the inner core at an angle θ less than 75° from the outer edge.

8. The drill of claim 7, wherein the first and second cutting portions have a depth defined by a distance between the closed planar end surface of the inner core and the end points of the first and second cutting portions, the depth ranging from 0.010 inches to 0.020 inches.

9. The drill of claim 1, wherein the drill is configured to back drilling a first portion of a through-hole from a top of a PCB to form a first blind via.

10. The drill of claim 9, wherein the drill stops drilling at an internal conductive trace of the PCB when the drill touches the internal conductive trace of the PCB, wherein the internal conductive trace is grounded during back drilling such that the drill accurately stops at the internal conductive trace that is grounded during back drilling.

11. The drill of claim 9, wherein the drill has a diameter larger than the through-hole of the PCB.

12. The drill of claim 9, wherein the drill is configured to back drilling a second portion of the PCB below the through-hole from a bottom of the PCB to form a second blind via.

* * * * *